US011341038B2

(12) United States Patent
Rehmeyer et al.

(10) Patent No.: US 11,341,038 B2
(45) Date of Patent: May 24, 2022

(54) DATA MOVEMENT OPERATIONS IN NON-VOLATILE MEMORY

(71) Applicant: Micron Technology, Inc., Boise, ID (US)

(72) Inventors: James S. Rehmeyer, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 16/808,607

(22) Filed: Mar. 4, 2020

(65) Prior Publication Data

US 2020/0201754 A1    Jun. 25, 2020

Related U.S. Application Data

(63) Continuation of application No. 15/831,698, filed on Dec. 5, 2017, now Pat. No. 10,606,743.

(51) Int. Cl.
*G06F 12/02* (2006.01)
*G06F 3/06* (2006.01)
(Continued)

(52) U.S. Cl.
CPC ........ *G06F 12/0246* (2013.01); *G06F 3/0619* (2013.01); *G06F 3/0656* (2013.01);
(Continued)

(58) Field of Classification Search
CPC .. G06F 12/0246; G06F 3/0619; G06F 3/0688; G06F 3/0679; G06F 11/1048;
(Continued)

(56) References Cited

U.S. PATENT DOCUMENTS 9,158,672 B1 * 10/2015 Zheng ................. G06F 12/0246
9,208,837 B2    12/2015 Kim et al.
(Continued)

FOREIGN PATENT DOCUMENTS

JP    2017-538206 A    12/2017
JP    2020-532038 A    11/2020
(Continued)

OTHER PUBLICATIONS

H. Hassan et al., "Crow: A Low-Cost Substrate for Improving DRAM Performance, Energy Efficiency, and Reliability," 2019 ACM/IEEE 46th Annual International Symposium on Computer Architecture (ISCA), 2019, pp. 129-142.*
(Continued)

*Primary Examiner* — Pierre Miche Bataille
(74) *Attorney, Agent, or Firm* — Brooks, Cameron & Huebsch, PLLC

(57) ABSTRACT

The present disclosure includes apparatuses and methods related to data movement operations in non-volatile memory. An example apparatus can comprise an array of non-volatile memory cells including a plurality of sections each with a plurality of rows and a controller configured to move data stored in a first portion of the array from a first row of a first section to a second row of the first section and move data stored in a second portion of the array from a second section to the first to create an open row in the second section in response to data from a particular number of portions of memory cells in the first section being moved within the first section.

20 Claims, 5 Drawing Sheets

(51) Int. Cl.
  *G11C 16/10* (2006.01)
  *G06F 11/10* (2006.01)
  *G11C 29/52* (2006.01)
  *G11C 16/08* (2006.01)
  *G11C 16/26* (2006.01)
  *G11C 16/34* (2006.01)
  *G11C 7/24* (2006.01)
  *G11C 7/06* (2006.01)

(52) U.S. Cl.
  CPC .......... *G06F 3/0679* (2013.01); *G06F 3/0688* (2013.01); *G06F 11/1008* (2013.01); *G06F 11/1048* (2013.01); *G11C 7/24* (2013.01); *G11C 16/08* (2013.01); *G11C 16/10* (2013.01); *G11C 16/26* (2013.01); *G11C 16/3495* (2013.01); *G11C 29/52* (2013.01); *G11C 7/06* (2013.01)

(58) Field of Classification Search
  CPC .... G06F 3/0656; G06F 11/1008; G06F 11/10; G06F 12/02; G06F 3/06; Y02D 10/00; G11C 16/34
  See application file for complete search history.

(56) References Cited

U.S. PATENT DOCUMENTS

| | | | |
|---|---|---|---|
| 9,478,293 B2 * | 10/2016 | Yanagida | G11C 16/0483 |
| 10,318,168 B2 * | 6/2019 | Lea | G06F 3/0635 |
| 2007/0297256 A1 | 12/2007 | Takase | |
| 2008/0037356 A1 | 2/2008 | Kajigaya | |
| 2015/0085589 A1 * | 3/2015 | Lu | G11C 7/1045 365/189.17 |
| 2015/0255159 A1 | 9/2015 | Tanaka | |
| 2016/0005447 A1 | 1/2016 | Manning | |
| 2016/0092122 A1 | 3/2016 | Agrawal et al. | |
| 2016/0139826 A1 | 5/2016 | Fontana et al. | |
| 2016/0267002 A1 | 9/2016 | Kanno et al. | |
| 2016/0284390 A1 | 9/2016 | Tomishima et al. | |
| 2017/0147211 A1 | 5/2017 | Shiah et al. | |
| 2017/0293449 A1 | 10/2017 | Sunwoo et al. | |
| 2019/0065077 A1 | 2/2019 | Sforzin et al. | |
| 2019/0066752 A1 * | 2/2019 | Fackenthal | G06F 11/1008 |

FOREIGN PATENT DOCUMENTS

| | | |
|---|---|---|
| JP | 2020-532791 A | 11/2020 |
| KR | 10-2014-0025938 | 3/2014 |
| KR | 10-2914-0070303 | 6/2014 |
| TW | I575376 B | 3/2017 |
| WO | 2016/077091 A1 | 5/2016 |
| WO | 2019/040403 A1 | 2/2019 |
| WO | 2019/046104 A1 | 3/2019 |

OTHER PUBLICATIONS

International Search Report and Written Opinion from related international application No. PCT/US2018/063570, dated Mar. 19, 2019, 11 pages.

Office Action from related Tawainese Patent Application No. 107143574, dated Jul. 31, 2019, 14 pages.

Notice of Rejection Ground from related Japanese Patent Application No. 2020-529422, dated Jul. 30, 2021, 4 pages.

Extended European Search Report from related European Patent Application No. 18886839.2, dated Aug. 26, 2021, 3 pages.

* cited by examiner

DATA MOVEMENT OPERATIONS IN NON-VOLATILE MEMORY

PRIORITY INFORMATION

This application is a Continuation of U.S. application Ser. No. 15/831,698, filed on Dec. 5, 2017, the contents of which are incorporated herein by reference.

TECHNICAL FIELD

The present disclosure relates generally to memory devices, and more particularly, to apparatuses and methods for data movement operations in non-volatile memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAIVI), resistive random access memory (RRAM), ferroelectric random access memory (FeRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

Memory can be part of a memory system used in computing devices. Memory systems can include volatile, such as DRAM, for example, and/or non-volatile memory, such as Flash memory or RRAM, for example.

DETAILED DESCRIPTION

Figure 1:
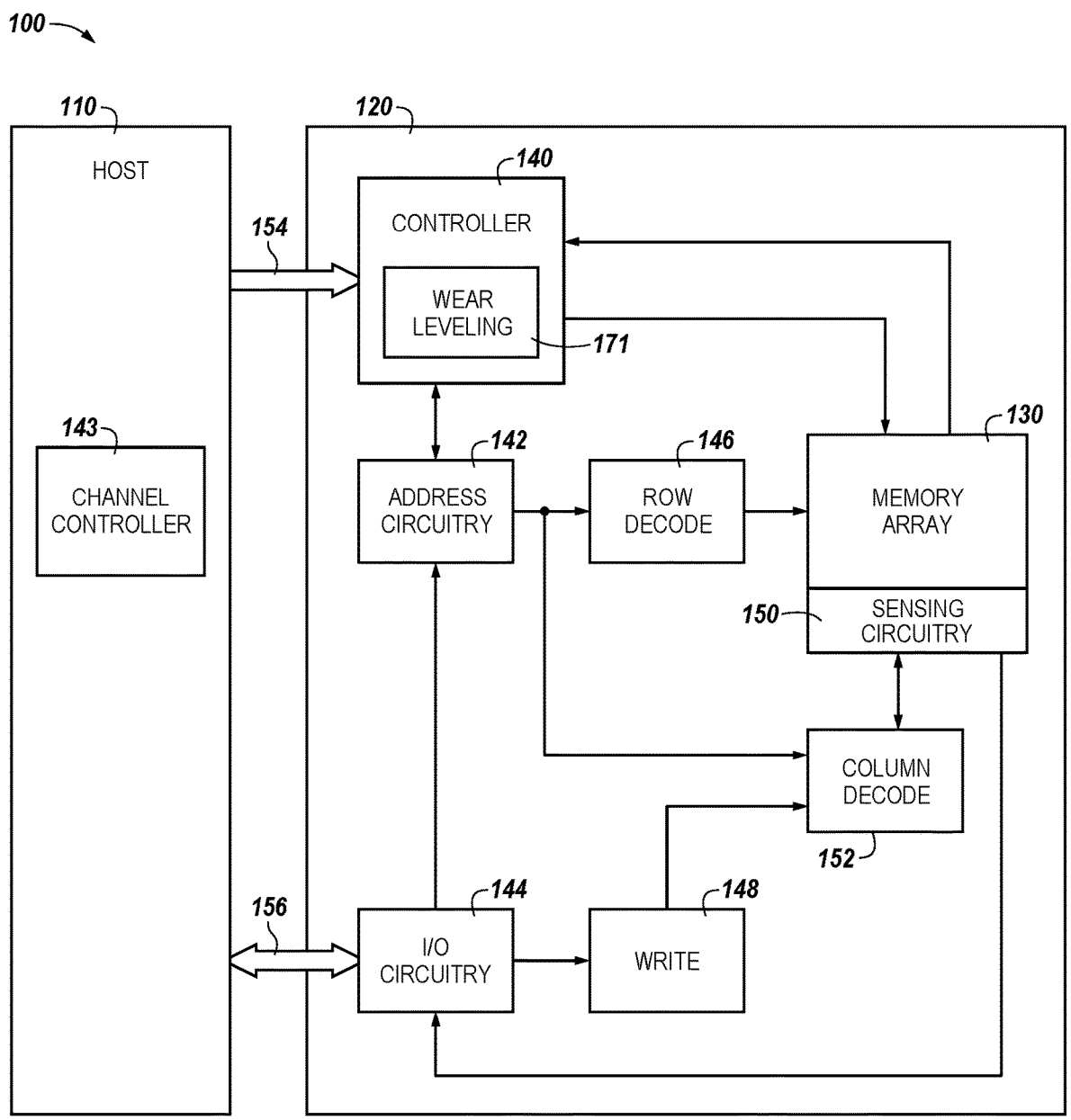
FIG. 1 is a block diagram of an apparatus in the form of a computing system including a memory device in accordance with a number of embodiments of the present disclosure.

The present disclosure includes apparatuses and methods related to data movement operations in non-volatile memory. An example apparatus can comprise an array of non-volatile memory cells including a plurality of sections each with a plurality of rows and a controller configured to move data stored in a first portion of the array from a first row of a first section to a second row of the first section and move data stored in a second portion of the array from a second section to the first section to create an open row in the second section in response to data from a particular number of portions of memory cells in the first section being moved within the first section.

In one or more embodiments of the present disclosure, a controller can be configured to move data stored in a first portion of the array from a first row of a first section to a second row of the first section, wherein the first section is coupled to a first number of sense amplifiers. The data stored in the first portion of the array of non-volatile memory cells can be moved from the first row to the second row by firing the first row and the second row of memory cells. An error correction operation can be performed on the data when moving between the first row and the second row. The first number of sense amplifiers can move the data stored in the first portion of the array of non-volatile memory cells from the first row to the second row by sensing and latching the data stored in the first portion. For example, a first number of sense amplifiers can be activated when moving the data stored in the first portion of the array of memory cells from the first row to the second row. The first portion of the array of non-volatile memory cells can include a portion of the first row or the entire first row.

In one or more embodiments of the present disclosure, data stored in the array can be moved from one portion of the array to another portion of the array to prevent data loss or data corruption. Data can be moved from one portion of the array to another portion of the array because memory cells wear out and become less reliable at storing data after being accessed a particular number of times. Moving data stored in the array to prevent data loss due to worn out cells can be referred to as wear leveling. Wear leveling algorithms can be configurable per non-volatile memory device. For example, a wear leveling algorithm can be different within a section of a non-volatile memory array and/or when moving data from section to section of the non-volatile memory array.

Data stored in the array can be moved from one portion of the array to another portion of the array to prevent a hacker from corrupting data. An attacker can corrupt data and cause data loss by accessing the same memory cells repeatedly until the memory cells are worn and no longer hold data reliably. Moving data from one portion of the array to another portion of the array can prevent data loss by moving data prior to the memory cell being corrupted.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices.

Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 which includes a memory array 130 in accordance with a number of embodiments of the present disclosure. As used herein, a memory device 120, controller 140, memory array 130, sensing circuitry 150, wear leveling 171 and/or a number of additional latches might also be separately considered an "apparatus."

Figure 4:
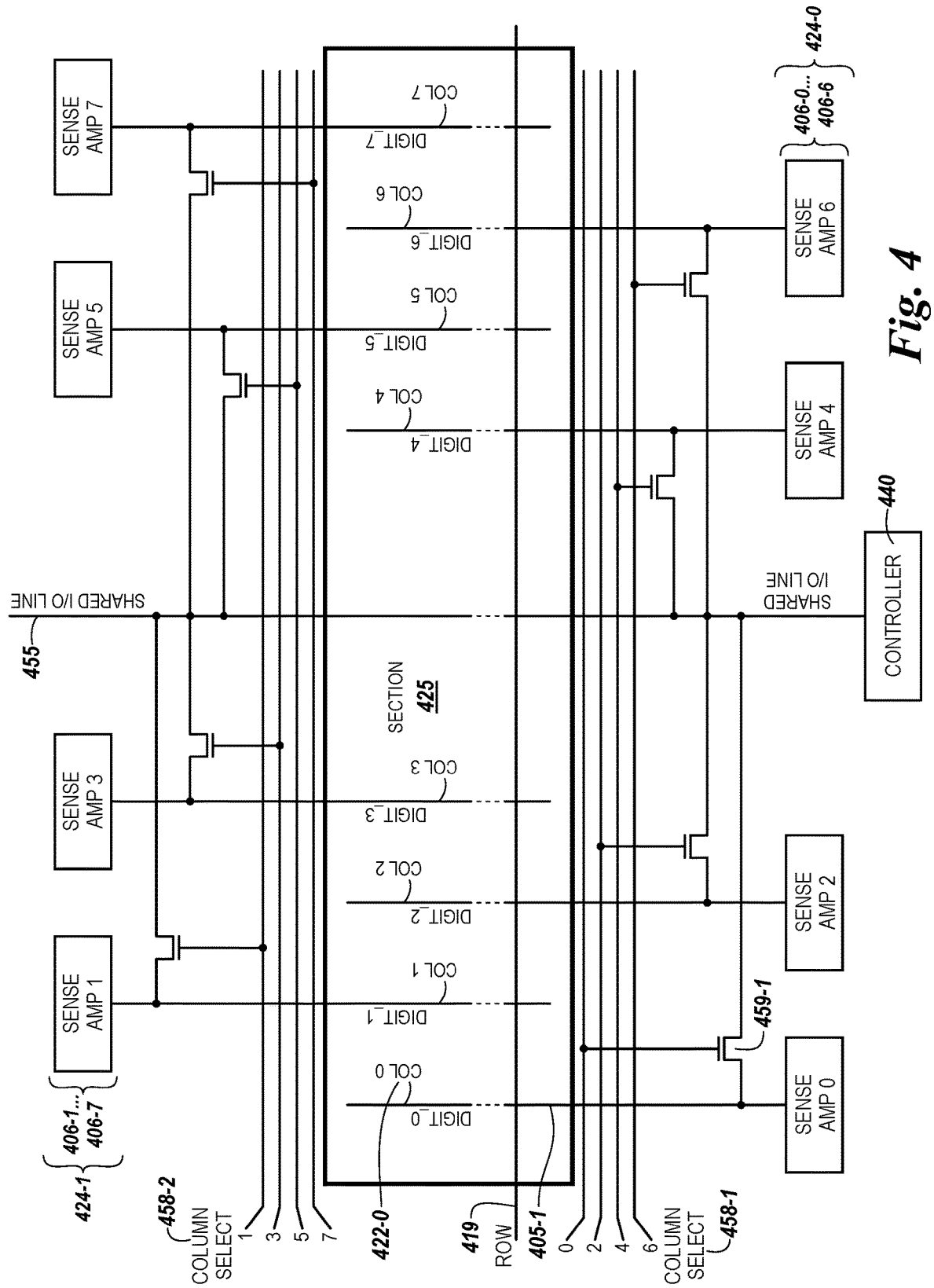
FIG. 4 is a schematic diagram illustrating circuitry for a plurality of shared I/O lines in a data path of an array in accordance with a number of embodiments of the present disclosure.

As used herein, the additional latches are intended to mean additional functionalities (e.g., amplifiers, select logic) that sense, couple, and/or move (e.g., read, store, cache) data values of memory cells in an array and that are distinct from the sensing component stripes (e.g. sensing component stripes 224-0, . . . 224-N-1 in FIG. 2) in a data path of the plurality of shared I/O lines (e.g. shared I/O lines 455 in FIG. 4). The logic stripes in a data path of a plurality of shared I/O lines local to the array, as shown in FIGS. 1 and 4, may be associated with various bank sections (e.g. bank sections 225-0, . . . 225-N-1 in FIG. 2) of memory cells in the bank 121-1 (e.g. bank 221 in FIG. 2) may be one of a plurality of banks on the memory device 120.

System 100 in FIG. 1 includes a host 110 coupled (e.g., connected) to the memory device 120. Host 110 may be a host system such as a personal laptop computer, a desktop computer, a digital camera, a smart phone, or a memory card reader, among various other types of hosts. Host 110 may include a system motherboard and/or backplane and may include a number of processing resources (e.g., one or more processors, microprocessors, or some other type of controlling circuitry). The system 100 may include separate integrated circuits or both the host 110 and the memory device 120 may be on the same integrated circuit. The system 100 may be, for instance, a server system and/or a high performance computing (HPC) system and/or a portion thereof. Although the examples shown in FIG. 1 illustrates a system having a Von Neumann architecture, embodiments of the present disclosure may be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 may be a 2D array, a 3D array, a FeRAM, a NAND flash array, and/or NOR flash array, among other types of non-volatile memory arrays. The array 130 may include memory cells arranged in rows coupled by access lines (which may be referred to herein as word lines or select lines) and columns coupled by sense lines (which may be referred to herein as data lines or digit lines).

Although a single array 130 is shown in FIG. 1, embodiments are not so limited. For instance, memory device 120 may include a number of arrays 130 (e.g., a number of banks of NAND flash cells, etc.).

The memory device 120 may include address circuitry 142 to latch address signals provided over a data bus 156 (e.g., an I/O bus connected to the host 110) by I/O circuitry 144 (e.g., provided to external ALU circuitry via local I/O lines and global I/O lines). As used herein, external ALU circuitry may enable input of data to and/or output of data from a bank (e.g., from and/or to the controller 140 and/or host 110) via a bus (e.g., data bus 156).

The channel controller 143 may include a logic component to allocate a plurality of locations (e.g., controllers for subarrays) in the arrays of each respective bank to store bank commands, application instructions (e.g., for sequences of operations), and arguments (PIM commands) for various banks associated with operations for each of a plurality of memory devices 120. The channel controller 143 may dispatch commands (e.g., PIM commands) to the plurality of memory devices 120 to store those program instructions within a given bank (e.g. bank 221 in FIG. 2) of a memory device 120. In some embodiments, the channel controller 143 can be located in the host 110.

Address signals are received through address circuitry 142 and decoded by a row decoder 146 and a column decoder 152 to access the memory array 130. Data may be sensed (read) from memory array 130 by sensing voltage and/or current changes on sense lines (digit lines) using a number of sense amplifiers, as described herein, of the sensing circuitry 150. A sense amplifier may read and latch a page (e.g., a row) of data from the memory array 130. Additional compute circuitry, as described herein, may be coupled to the sensing circuitry 150 and may be used in combination with the sense amplifiers to sense, store (e.g., cache and/or buffer), perform compute functions (e.g., operations), and/or move data. The I/O circuitry 144 may be used for bi-directional data communication with host 110 over the data bus 156 (e.g., a 64 bit wide data bus). The write circuitry 148 may be used to write data to the memory array 130.

Controller 140 may decode signals (e.g., commands) provided by control bus 154 from the host 110. These signals may include chip enable signals, write enable signals, and/or address latch signals that may be used to control operations performed on the memory array 130, including data sense, data store, data movement (e.g., copying, transferring, and/or transporting data values), data write, and/or data erase operations, among other operations. In various embodiments, the controller 140 may be responsible for executing instructions from the host 110 and/or accessing the memory array 130. The controller 140 may be a state machine, a sequencer, or some other type of controller. The controller 140 may control shifting data (e.g., right or left) in a row of an array (e.g., memory array 130) and execute microcode instructions to perform operations such as compute operations (e.g., AND, OR, NOR, XOR, add, subtract, multiply, divide, etc.). The controller 140 may include wear leveling logic 171. The controller 140 may communicate with the wear leveling logic 171 to move data as a wear leveling operation between rows and/or between sections to prevent data loss.

Examples of the sensing circuitry 150 are described further below (e.g., in FIGS. 2, 3, 4, and 5). For instance, in some embodiments, the sensing circuitry 150 may include a number of sense amplifiers. In some embodiments, the sensing circuitry 150 may include the number of sense amplifiers and a corresponding number of compute components, which may serve as an accumulator and may be used to perform operations in each subarray (e.g., on data associated with complementary sense lines) in addition to the in data path compute operations described herein.

In some embodiments, the sensing circuitry 150 may be used to perform operations using data stored by memory array 130 as inputs and participate in movement of the data for copy, transfer, transport, writing, logic, and/or storage operations to a different location in the memory array 130 and/or in logic stripes.

In contrast, embodiments herein perform compute functions on data values, moved to a plurality of logic stripes (e.g. logic stripes 224-0, . . . 224-N-1 in FIG. 2) via a plurality of shared I/O lines (e.g. shared I/O lines 455 in FIG. 4) from the rows and/or sub rows of the array, in a compute unit in a data path local to the array.

Enabling an I/O line may include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry 150 may be used to perform operations without enabling column decode lines of the array.

Figure 2:
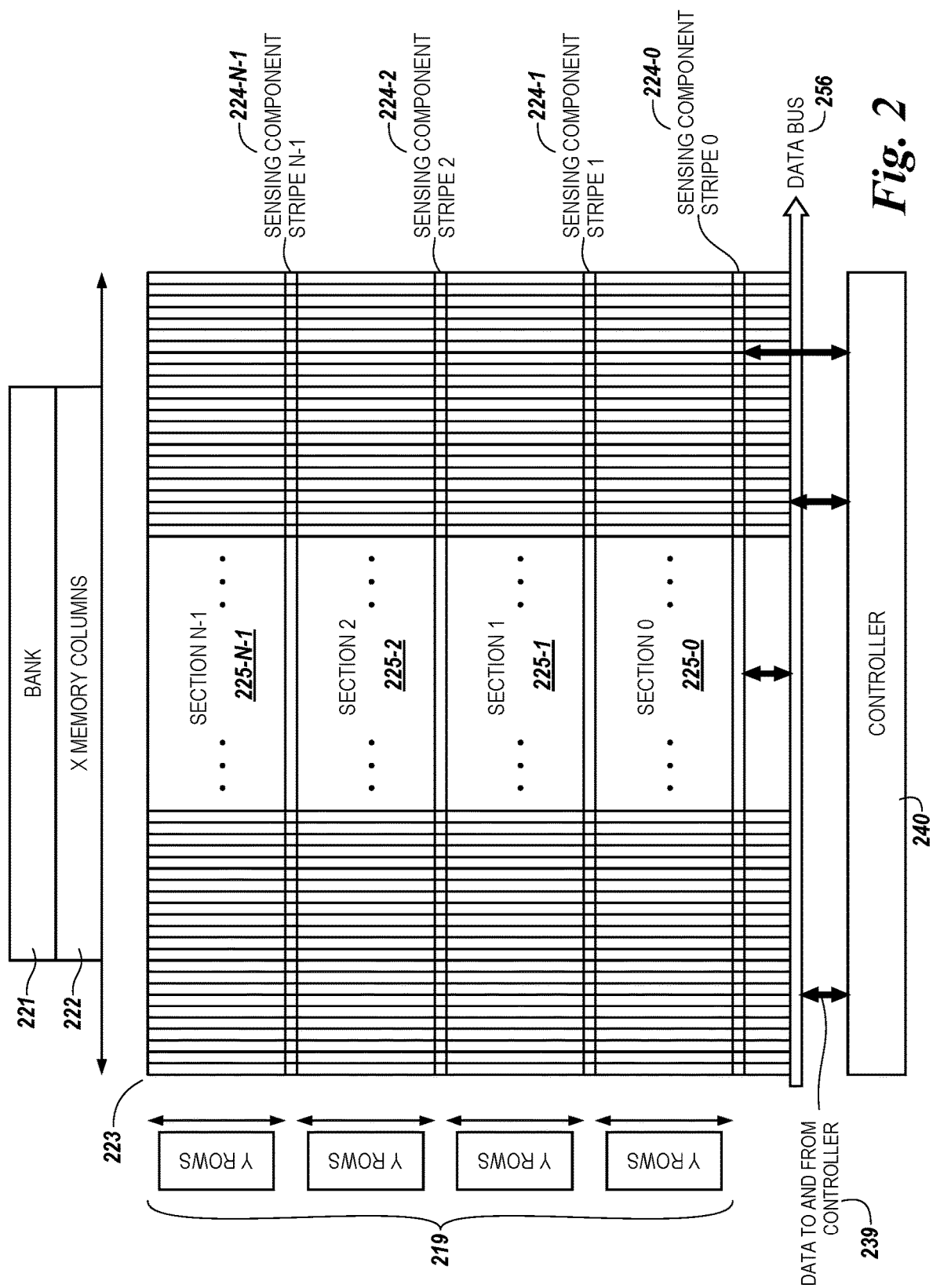
FIG. 2 is a block diagram of a plurality of sections of a bank of a memory device in a computing system in accordance with a number of embodiments of the present disclosure.

FIG. 2 is a block diagram of a plurality of sections, e.g., sections 225-0, 225-1, . . . 225-N-1, of a bank 221 of a memory device (e.g. memory device 120 in FIG. 1) in a computing system (e.g. computing system 100 in FIG. 1) in accordance with a number of embodiments of the present disclosure. By way of illustration, FIG. 2 shows a bank section 223 of the bank 221 of the memory device. For example, bank section 223 can represent an example bank section of a number of bank sections of the bank 221 of the memory device, e.g., bank section 0, bank section 1, . . . , bank section M-1 (not shown). As shown in FIG. 2, a bank section 223 can include a plurality of memory columns 222 shown horizontally as X, e.g., 4096, 8192, or 16,384 columns, among various possibilities, in an example bank section. Additionally, the bank section 223 may be divided into section 0, section 1, . . . , and section N-1, e.g., 32, 64, or 128 sections, among various possibilities, shown at 225-0, 125-1, . . . 225-N-1, respectively, that are separated by amplification regions configured to be coupled to a data path. As such, the sections 225-0, 225-1, . . . 225-N-1 can each have amplification regions 224-0, 224-1, . . . 224-N-1 that correspond to sensing component stripe 0, sensing component stripe 1, . . . , and sensing component stripe N-1, respectively.

Each column 222, e.g., single or each pair of sense or digit lines, is configured to be coupled to sensing circuitry (e.g. sensing circuitry 150 in FIG. 1). As such, each column 222 in a section 225 can be coupled individually to a sense amplifier that contributes to a sensing component stripe 224 for that section. For example, as shown in FIG. 2, the bank section 223 can include sensing component stripe 0, sensing component stripe 1, . . . , sensing component stripe N-1 that each have sensing circuitry with sense amplifiers that can, in various embodiments, be used as registers, cache and/or data buffering and that are coupled to each column 222 in the sections 225-0, 225-1, . . . 225-N-1.

Each of the of the sections 225-0, 225-1, . . . 225-N-1 can include a plurality of rows 219 shown vertically as Y, e.g., each section may include 256, 512, 1024 rows, among various possibilities, in an example bank. Embodiments are not limited to the example horizontal and vertical orientation of columns and rows described herein or the example numbers thereof. Each of the plurality of rows 219 can include a single memory cell selectably coupled to each sense line. Each of the complementary memory cells of the pair can be coupled to one of a respective pair of sense lines at a position of the sense lines on the row. As such, the number of memory cells in a row can correspond to the number of sense lines that intersect that row.

As shown in FIG. 2, portions of the sensing circuitry, e.g., sense amplifiers, compute components, etc., can be separated between a number of sensing component stripes 224 that are each physically associated with a section of memory cells 225 in the bank section 223. The sense amplifiers may sense data values stored by memory cells of the sections and/or the sense amplifiers may sense residual voltages on the sense lines as a reference voltage for determination of a sensed data value.

In some embodiments, the sense amplifiers may at least temporarily store, e.g., cache, sensed data values. The compute components described herein in connection with the sense amplifiers may, in some embodiments, perform compute operations on the cached data values in the plurality of sensing component stripes 224.

As shown in FIG. 2, the bank section 223 can be associated with controller 240. The controller 240 shown in FIG. 2 can, in various embodiments, represent at least a portion of the functionality embodied by and contained in the controller 140 shown in and described in connection with FIG. 1. The controller 240 can direct, e.g., control, input of commands and data 239 to the bank section 223 and/or output, e.g., movement, of data from the bank section 223.

The bank section 223 can include a data bus, e.g., a 64 bit wide data bus which can correspond to the data bus 256. Each data bus for each bank of sections, e.g., 225-0, 225-1, . . . 225-N-1, can be referred to as a portion of a data bus that contributes to formation of a combined data bus, e.g., for a plurality of banks and/or memory devices. As such, in some embodiments, eight 64 bit wide data bus portions for eight banks can contribute to a 512 bit wide combined data bus. However, embodiments are not limited to a particular data bus. Alternatively or in addition, each bank can individually use the entirety of the 512 bit wide combined data bus, although one bank at a time. Various combinations of using the data bus portions also may be utilized. For example, one bank may use four data bus portions at the same time as four other banks each use one of the remaining four data bus portions, among other possibilities.

In order to appreciate the performance of operations described herein, a discussion of an apparatus for implementing such techniques follows. For example, such an apparatus may be a memory device having a controller 240, that is on chip with a memory array (e.g. memory array 130 in FIG. 1) and/or sensing circuitry (e.g. sensing circuitry 150 in FIG. 1)

Figure 3:
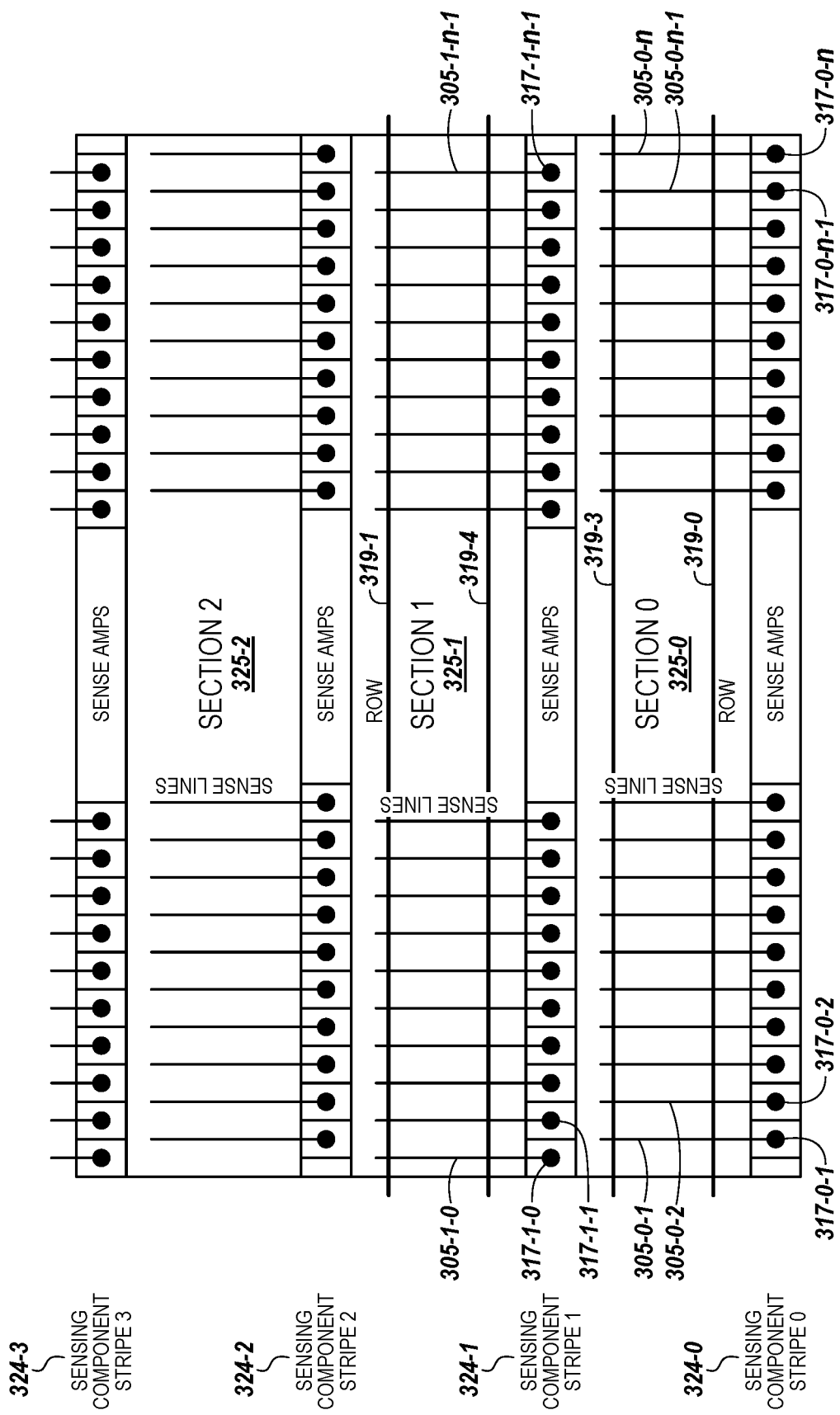
FIG. 3 is a block diagram of sections in a bank of a memory device in accordance with a number of embodiments of the present disclosure.

FIG. 3 is a block diagram of sections, e.g., section 0 at 325-0, section 1 at 325-1, section 2 at 325-2, etc., in a bank of a memory device in accordance with a number of embodiments of the present disclosure. When row 319-1 in section 325-1 is selected and opened, e.g., fired by execution of a fire row command, sense amplifiers, e.g., 317-1-0, 317-1-1, . . 317-1-$n$-1, in sensing component stripe 1 at 324-1 and/or component stripe 2 at 324-2 may be enabled, e.g., fired, to sense and/or store voltage potentials from sense lines, e.g., 305-1-0, . . . , 305-1-$n$-1, coupled to each of the sense amplifiers.

When row 319-0 in section 325-0 is selected and opened, e.g., fired by execution of a fire row command, sense amplifiers, e.g. 317-0-1, 317-0-2, . . . , 317-0-$n$-1, and 317-0-*n*, in sensing component stripe 0 at 324-0 and/or sensing component stripe 1 at 324-1 may be enabled, e.g., fired to sense and/or store voltage potentials from sense lines, e.g., 305-0-1, 305-0-2, . . . , **305-0-*n*-1, and 305-0-*n*** coupled to each of the sense amplifiers.

In one or more embodiments of the present disclosure, data can be stored in a first portion of an array of non-volatile memory cells. In some examples, a single sense amplifier can be activated to move the first portion of an array of non-volatile memory cells between rows of the same section. The first portion of the array of non-volatile memory cells can include row 319-0 or a portion of row 319-0. The first portion of the array of non-volatile memory cells can be stored in section 0 at 325-0, for example. The first portion of data stored in section 0 at 325-0 can be moved from row 319-0 to row 319-3. Row 319-3 can be an empty row that does not contain data. A sense amplifier 317-0-1 can be activated when moving the data stored in section 0 at 325-0 from a first row 319-0 to a second row 319-3. When the data is moved to row 319-3, row 319-0 becomes an empty row. In some examples, a portion of data from a different section can be moved to the empty row 319-0 of section 0 to allow the different section to have an empty row to allow for movement of data between rows of the different section.

In one or more embodiments of the present disclosure, a second portion of the array of non-volatile memory can be moved to a second section of the array of non-volatile memory cells. In some examples, a plurality of sense amplifiers can be activated to move the second portion of the array of non-volatile memory cells between sections. For example, activating two sense amplifiers instead of one sense amplifier can double the amount of power needed to move a portion of non-volatile memory cells. Power consumption can be reduced by moving portions of the array between rows and limiting the movement of the portions of the array between sections. The second portion of the array of non-volatile memory cells can be stored in section 0 at 325-0, for example. The data stored in section 0 at 325-0 can be moved to section 1 at 325-1. For example, data stored in row 319-0 can be moved from section 0 at 325-0 to row 319-1 and/or 319-4 in section 1 at 325-1. Row 319-1 and/or row 319-4 can be an empty row. Data stored in a second section can be moved to the first section in response to data from a particular number of portions of memory cells in the first section being moved within the first section. The data stored in the second portion of the array of memory cells can be moved from section 0 at 325-0 to section 1 at 325-1 prior to the data stored in the first portion of the array of non-volatile memory cells being moved again.

In one or more embodiments of the present disclosure, sense amplifier 317-0-1 and sense amplifier 317-1-0 can be activated when moving the data stored in section 0 at 325-0 to section 1 at 325-1.

In one or more embodiments of the present disclosure, data stored in section 2 at 325-2 can be moved to section 1 at 325-1 in response to data from a particular number of portions of memory cells in section 1 at 325-1 being moved within section 1 at 325-1.

FIG. 4 is a schematic diagram illustrating circuitry for a shared I/O line in a data path of an array in accordance with a number of embodiments of the present disclosure. FIG. 4 shows eight sense amplifiers (e.g., sense amplifiers 0, 1, . . . , 7 shown at 406-0, 406-1, . . . , 406-7, respectively) each coupled to a shared I/O line 455.

Data values present on digit line 405-1 may be loaded into the sense amplifier 406-0. The data value on the digit line 405-1 may be the data value stored by the sense amplifier 406-0 when the sense amplifier is fired.

An individual sense amplifier, or a combination of one sense amplifier with one compute component, may contribute to the sensing circuitry (e.g. sensing circuitry 150 in FIG. 1) coupled to a shared I/O line 455 shared by a number of logic stripes in a data path of the shared I/O lines 455.

The circuitry illustrated in FIG. 4 also shows column select circuitry 458-1 and 458-2 that is configured to implement data movement operations by multiplexing with respect to particular columns 422 of a section 425, the digit line 405-1 associated therewith, and the shared I/O line 455 as directed by the controller 440. For example, column select circuitry 458-1 has select lines 0, 2, 4, and 6 that are configured to couple with corresponding columns, such as column 0 (422-0), column 2, column 4, and column 6. Column select circuitry 458-2 has select lines 1, 3, 5, and 7 that are configured to couple with corresponding columns, such as column 1, column 3, column 5, and column 7.

Controller 440 may be coupled to column select circuitry 458 to control select lines (e.g., select line 0) to access data values stored by the sense amplifiers and/or present on the digit line (e.g., 405-1 when selection transistors 459-1 are activated via signals from select line 0). Activating the selection transistors 459-1 as directed by the controller 440 enables coupling of sense amplifier 406-0 and/or digit line 405-1 of column 0 (422-0) to move data values on digit line 0 to shared I/O line 455. For example, the moved data values may be data values from a particular row 419 stored (cached) in sense amplifier 406-0. Data values from each of columns 0 through 7 may similarly be selected by controller 440 activating the appropriate selection transistors.

Moreover, enabling (e.g., activating) the selection transistors (e.g., selection transistors 459-1 may enable a particular sense amplifier to be coupled with a shared I/O line 455 such that data values stored by an amplifier may be moved to (e.g., placed on and/or transferred to) the shared I/O line 455. In some embodiments, one column at a time is selected (e.g., column 422-0) to be coupled to a particular shared I/O line 455 to move (e.g., copy, transfer, and/or transport) the stored data values.

Figure 5:
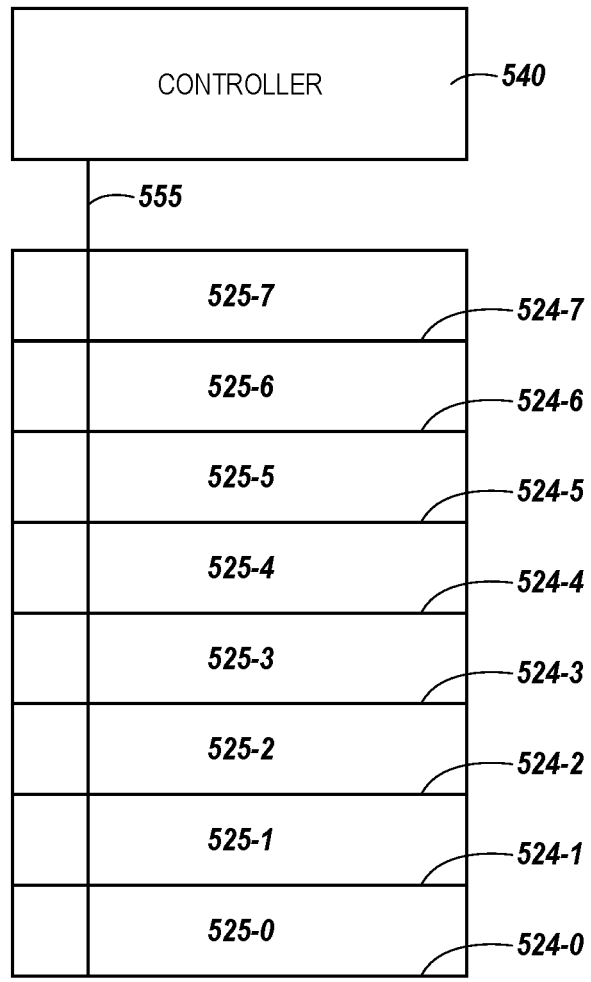
FIG. 5 illustrates a diagram associated with performing moving operations in non-volatile memory in accordance with a number of embodiments of the present disclosure.

FIG. 5 illustrates a diagram associated with performing moving operations in non-volatile memory in accordance with a number of embodiments of the present disclosure. FIG. 5 shows a controller 540 coupled to a number of sections of an array of non-volatile memory 525-0, . . . , 525-7 via a shared I/O line 555 and a number of sensing component stripes 524-0, . . . , 524-7.

Data stored in section 525-0 can be moved to one of the number of sections of the array of non-volatile memory. For example, the data stored in section 525-0 can be moved to section 525-1 when a row in section 525-0 is selected and opened, e.g., fired by execution of a fire row command, sense amplifiers in sensing component stipe 524-0 may be enabled, e.g., fired, to sense and/or store voltage potentials from sense lines coupled to each of the sense amplifiers. The sensing component stripe 524-0 and the shared I/O line 555 can transmit the data stored in section 525-0 to the controller 540. The controller can transmit the data from section 525-0 via the shared I/O line 555 and the sensing component stripe 524-1 to section 525-1. A row in section 525-1 can be selected and opened, e.g. fired by execution of a fire row command, sense amplifiers in sensing component stripe 524-1 can be enabled, e.g., fired to store voltage potentials from the sense lines coupled to each of the sense amplifiers.

In one or more embodiments of the present disclosure, the controller 540 can include a counter. The counter can count data stored in a plurality of portions of the array of non-volatile memory cells moved between a plurality of rows within a particular section sections 525-0, . . . , 252-7. The controller 540 can be configured to move data stored in a particular row of a section, for example section 525-0 in a first particular order. The controller 540 can be configured to move data stored in a particular row of another section, for example section 525-1 in a second particular order. The controller 540 can be configured to move data randomly from one section to another. For example, when moving data from a particular section to another section to open a row for wear leveling within the particular section, the section that the data is moved to can be random, be based on in a particular order that is unique for each memory device, and/or be based on a particular order that can be changed. A first portion of data can be moved from section 525-0 to section 525-1 and the next time data is moved from section 525-0 it can be moved to section that is different than section 525-1, such as section 525-6. The controller 540 can also be configured to perform an error correction operation on a portion of the data when the portion of the data is being moved between rows or between sections.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of non-volatile memory cells including a plurality of sections each with a plurality of rows; and
a controller configured to:
move a first portion of data stored in a first section of the array from a first row of a number of rows in the first section to a second row of the number of rows in the first section; and
move a second portion of data from a second section to the first section to create an open row in the second section in response to the first portion of data being moved to each of the number of rows in the first section, wherein the first portion of data is moved to each of the number of rows in the first section prior to moving the second portion of data from the second section to the first section to reduce power consumption of the apparatus.

2. The apparatus of claim 1, wherein the open row in the second section allows for movement of a third portion of data between a number of rows in the second section.

3. The apparatus of claim 2, wherein a second number of sense amplifiers are activated when moving the third portion of data between the number of rows in the second section.

4. The apparatus of claim 1, wherein the open row in the second section is used for wear leveling.

5. The apparatus of claim 1, wherein a first number of sense amplifiers are activated when moving the first portion of data from the first row to the second row.

6. The apparatus of claim 1, wherein a first number of sense amplifiers and a second number of sense amplifiers are activated when moving the second portion of data from the second section to the first section.

7. The apparatus of claim 1, wherein the controller is configured to move a fourth portion of data from a third section to the second section in response to the third portion of data being moved to each of the number of rows in the second section.

8. The apparatus of claim 1, wherein the controller includes a counter to count a number of times the first portion of data is moved between each row of the number of rows in each section of the plurality of sections.

9. The apparatus of claim 1, wherein the array of non-volatile memory cells is a 3D array.

10. An apparatus, comprising:
an array of non-volatile memory cells including a plurality of sections each with a plurality of rows; and
a controller configured to:
move a first portion of data from a first row of a number of rows in a first section to a second row of the number of rows in the first section, wherein the first section is coupled to a first number of sense amplifiers; and
move a second portion of data from a second section to the first section to create an open row for movement of a third portion of data between a number of rows in the second section in response to the first portion of data being moved between each of the number of rows in the first section, wherein the second section is coupled to a second number of sense amplifiers, and wherein the first portion of data is moved between each of the number of rows in the first section prior to moving the second portion of data from the second section to the first section to reduce power consumption of the apparatus.

11. The apparatus of claim 10, wherein the controller is configured to move the first portion of data from the first row to the second row by firing the first row of memory cells.

12. The apparatus of claim 10, wherein the controller is configured to move the first portion of data from the first row to the second row by sensing and latching the first portion of data in one of the first number of sense amplifiers.

13. The apparatus of claim 10, wherein the controller is configured to move the first portion of data from the first row to the second row by firing the second row of memory cells.

14. The apparatus of claim 10, wherein the controller is configured to move the first portion of data from the first row to the second row by moving the first portion of data from the one of the first number of sense amplifiers to the second row.

15. A method, comprising:
moving a first portion of data stored in an array of non-volatile memory cells from a first row of a number of rows in a first section of the array of non-volatile memory cells to a second row of the number of rows in the first section of the array of non-volatile memory cells; and
moving a second portion of data stored in the array of non-volatile memory cells from a second section of the array of non-volatile memory cells to the first section of the array of non-volatile memory cells to create an open row in the second section for wear leveling in response to the first portion of data being moved to each of the number of rows in the first section, wherein the first portion of data is moved to each of the number of rows in the first section prior to moving the second portion of data from the second section to the first section to reduce power consumption of the array of non-volatile memory cells.

16. The method of claim 15, further comprising moving a third portion of data from a third row of the second section to a fourth row of the second section.

17. The method of claim 15, further comprising activating a first number of sense amplifiers when moving the first portion of data from the first row to the second row.

18. The method of claim 15, further comprising activating a first number of sense amplifiers and a second number of sense amplifiers when moving the second portion of data from the second section to the first section.

19. The method of claim 15, further comprising moving a third portion of data from a third section to the second section in response to the second portion of data being moved to each of a number of rows in the second section.

20. The method of claim 19, further comprising activating a second number of sense amplifiers and a third number of sense amplifiers when moving the third portion of data from the third section to the second section.

* * * * *